(12) United States Patent
Choi et al.

(10) Patent No.: US 10,032,852 B2
(45) Date of Patent: Jul. 24, 2018

(54) SINGLE POLY NONVOLATILE MEMORY CELLS

(71) Applicant: SK hynix Inc., Gyeonggi-do (KR)

(72) Inventors: Kwang Il Choi, Chungcheongbuk-do (KR); Sung Kun Park, Chungcheongbuk-do (KR); Nam Yoon Kim, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/212,049

(22) Filed: Jul. 15, 2016

(65) Prior Publication Data
US 2017/0236829 A1    Aug. 17, 2017

(30) Foreign Application Priority Data
Feb. 17, 2016 (KR) .................. 10-2016-0018201

(51) Int. Cl.
| | | |
|---|---|---|
| *H01L 27/115* | (2017.01) | |
| *H01L 49/02* | (2006.01) | |
| *H01L 27/06* | (2006.01) | |
| *H01L 27/11524* | (2017.01) | |
| *H01L 27/11558* | (2017.01) | |

(52) U.S. Cl.
CPC .......... *H01L 28/40* (2013.01); *H01L 27/0629* (2013.01); *H01L 27/11524* (2013.01); *H01L 27/11558* (2013.01)

(58) Field of Classification Search
CPC ............... H01L 27/11521; H01L 28/40; H01L 27/0629; H01L 29/7881

USPC ........................................................ 257/298
See application file for complete search history.

(56) References Cited

U.S. PATENT DOCUMENTS

| | | | |
|---|---|---|---|
| 5,886,378 A | 3/1999 | Wang | |
| 2009/0201742 A1* | 8/2009 | Lee ..................... | G11C 16/0441 365/185.24 |
| 2014/0177338 A1* | 6/2014 | Ching ................ | G11C 16/0441 365/185.14 |
| 2014/0293709 A1* | 10/2014 | Kwon ................ | G11C 16/0441 365/185.33 |
| 2015/0303203 A1* | 10/2015 | Song ..................... | G11C 16/26 365/218 |
| 2016/0013194 A1* | 1/2016 | Lin ................... | H01L 27/11521 365/185.29 |

FOREIGN PATENT DOCUMENTS

KR    101357847    2/2014

* cited by examiner

*Primary Examiner* — Marc Armand
*Assistant Examiner* — Sue Tang
(74) *Attorney, Agent, or Firm* — IP & T Group LLP

(57) ABSTRACT

A single-poly nonvolatile memory cell includes a coupling capacitor, a cell transistor and a selection transistor. The cell transistor has a floating gate, a first source, and a first drain. The floating gate is coupled to an array control gate/source line through the coupling capacitor. The first source is coupled to the array control gate/source line. The selection transistor has a selection gate, a second source, and a second drain. The selection gate is coupled to a word line. The second source is coupled to the first drain. The second drain is coupled to a bit line.

12 Claims, 17 Drawing Sheets

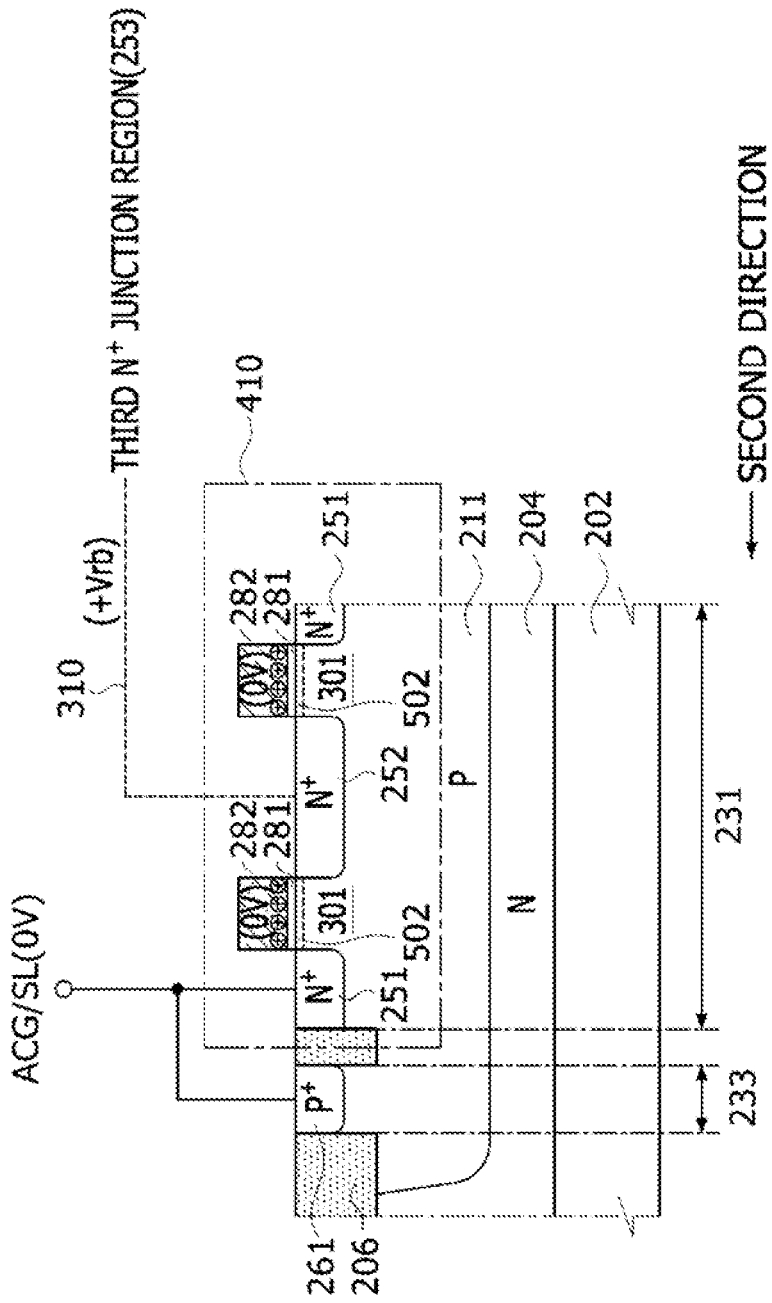

SINGLE POLY NONVOLATILE MEMORY CELLS

CROSS-REFERENCE TO RELATED APPLICATION

The present application claims priority under 35 U.S.C 119(a) to Korean Application No. 10-2016-0018201, filed on Feb. 17, 2016, which is herein incorporated by reference in its entirety.

BACKGROUND

1. Technical Field

Various embodiments of the present disclosure relate to nonvolatile memory devices and, more particularly, to single-poly nonvolatile memory cells.

2. Related Art

It is well known that a nonvolatile memory device can be utilized as a system-on-chip (SOC) embedded memory. However, general nonvolatile memory devices are manufactured using a double-poly process, rather than by using a standard complementary metal oxide semiconductor (CMOS) process. Thus, there is a limit which applies to general nonvolatile memory devices having the embedded memories. Furthermore, as the nonvolatile memory devices are formed in stacked structures, a manufacturing process becomes complex since a polysilicon deposition process and an etching process are separately performed to form floating gates and control gates. Additionally, since a floating gate and a control gate are formed in a stacked structure, it is highly likely that a misalignment occurs in the manufacturing process, particularly, in an etching process, thus deteriorating production yield. Accordingly, a single-poly nonvolatile memory device that can be manufactured by a standard CMOS process is being proposed.

SUMMARY

According to an embodiment, a single-poly nonvolatile memory cell includes a coupling capacitor, a cell transistor and a selection transistor. The cell transistor has a floating gate, a first source, and a first drain. The floating gate is coupled to an array control gate/source line through the coupling capacitor. The first source is coupled to the array control gate/source line. The selection transistor has a selection gate, a second source, and a second drain. The selection gate is coupled to a word line. The second source is coupled to the first drain. The second drain is coupled to a bit line.

According to an embodiment, a single-poly nonvolatile memory cell includes a first P-type well region and a second P-type well region disposed in an N-type semiconductor region and spaced apart from each other, wherein first, second, and third active regions are formed in the first P-type well region and spaced apart from each other, wherein a fourth active region is formed in the second P-type well region, a first N+-type junction region and a second N+-type junction region disposed in the first active region and spaced apart from each other by a coupling/channel region, a third N+-type junction region and a fourth N+-type junction region disposed in the second active region and spaced apart from each other by a channel region, a first P+-type contact region disposed in a third active region, a second P+-type contact region coupled to a tunneling region in the fourth active region, a read selection gate layer disposed over the channel region, a floating gate layer disposed over the coupling/channel region and extending to over the tunneling region, and an interconnection connecting the second N+-type junction region to the third N+-type junction region.

BRIEF DESCRIPTION OF THE DRAWINGS

Various embodiments of an inventive concept will become more apparent in view of the attached drawings and accompanying detailed description, in which:

FIG. 17 is a cross-sectional view illustrating a read operation of the erased single-poly nonvolatile memory cell of FIG. 5.

DETAILED DESCRIPTION OF THE EMBODIMENTS

In the following description of the embodiments, it will be understood that the terms "first" and "second" are intended to identify an element, but are not used to define only the element itself or to mean a particular sequence. In addition, when an element is referred to as being located "on", "over", "above", "under" or "beneath" another element, it is intended to mean a relative position relationship, but not used to limit certain cases in which the element directly contacts the other element, or at least one intervening element is present therebetween. Accordingly, terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
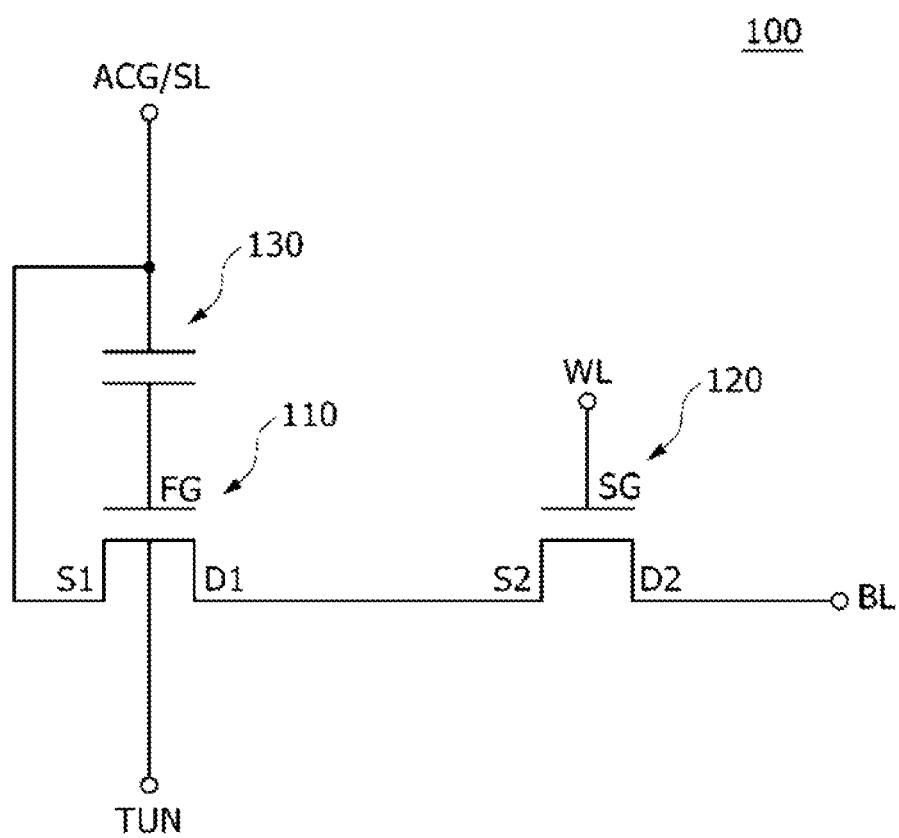
FIG. 1 is an equivalent circuit diagram illustrating a single-poly nonvolatile memory cell according to an embodiment.

FIG. 1 is an equivalent circuit diagram illustrating a single-poly nonvolatile memory cell 100 according to an embodiment. Referring to FIG. 1, the single-poly nonvolatile memory cell 100 includes a cell transistor 110, a selection transistor 120, and a coupling capacitor 130.

The cell transistor 110 has a floating gate FG, a first source S1, and a first drain D1. The floating gate FG is coupled to an array control gate/source line ACG/SL through the coupling capacitor 130. The array control gate/source line ACG/SL is directly coupled to the first source S1. The bulk of the cell transistor 110 is coupled to a tunneling line TUN.

The selection transistor 120 has a selection gate SG, a second source S2 and a second drain D2. The selection gate SG is coupled to a word line WL. The second source S2 is coupled to the first drain D1 of the cell transistor 110. The second drain D2 is coupled to a bit line BL. The cell transistor 110 and the selection transistor 120 may be composed of N-channel type MOS transistors.

Figure 2:
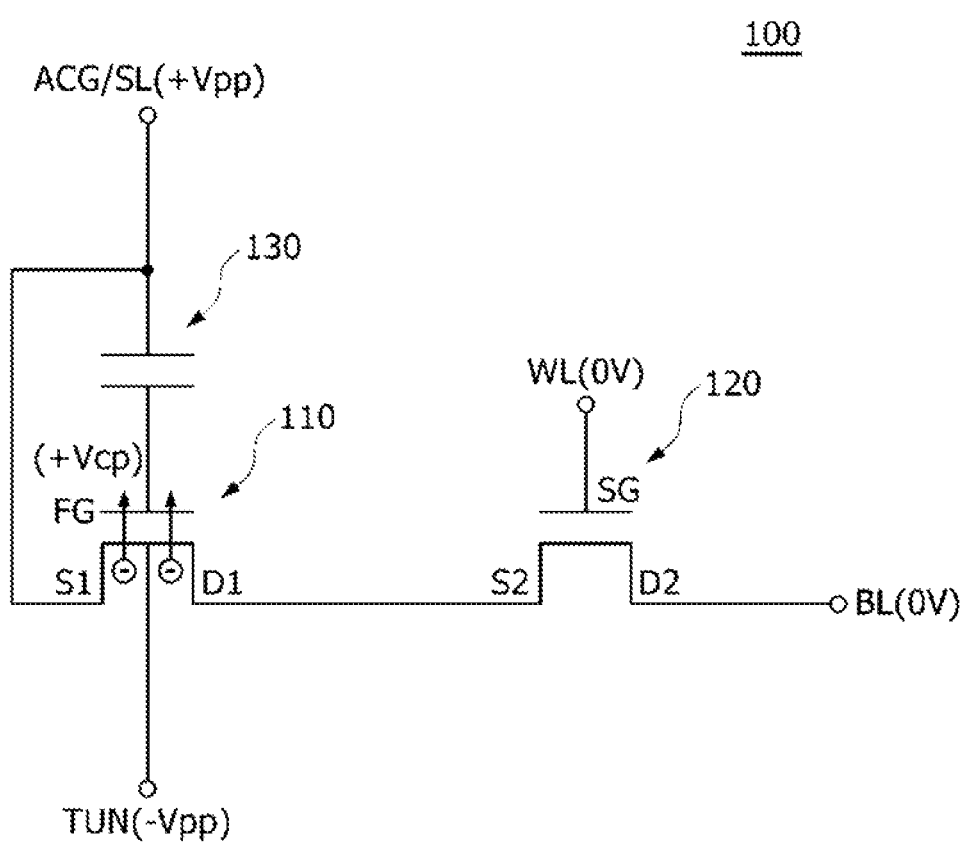
FIG. 2 is a circuit diagram illustrating a program operation of the single-poly nonvolatile memory cell of FIG. 1.

FIG. 2 is a circuit diagram illustrating a program operation of the single-poly nonvolatile memory cell 100 according to an embodiment. The same reference numerals used in FIG. 1 represent the same elements. Referring to FIG. 2, to program the single-poly nonvolatile memory cell 100, a positive program voltage +Vpp and a negative program voltage −Vpp are applied to the array control gate/source line ACG/SL and to the tunneling line TUN, respectively. The positive program voltage +Vpp and the negative program voltage −Vpp may have the same value and opposite polarity. In another embodiment, the positive program voltage +Vpp and the negative program voltage −Vpp may have different values from each other. The positive program voltage +Vpp and the negative program voltage −Vpp have values or levels enabling electrons in the bulk to be tunneled to the floating gate FG by a Fowler-Nordheim (F-N) tunneling mechanism due to a potential difference between the negative program voltage −Vpp and a coupling voltage coupled to the floating gate FG by the positive program voltage +Vpp. In an embodiment, the positive program voltage +Vpp and the negative program voltage −Vpp may be about +5V and about −5V, respectively. A ground voltage, for example, 0V is applied to the word line WL and to the bit line BL. Accordingly, the selection transistor 120 is turned-off during the program operation.

A positive program coupling voltage +Vcp is induced to the floating gate FG of the cell transistor 110. The positive program coupling voltage +Vcp may be induced by a coupling operation of the coupling capacitor 130 and the positive program voltage +Vpp applied through the array control gate/source line ACG/SL. A potential difference between the positive program coupling voltage +Vcp and the negative program voltage −Vpp is generated between the floating gate FG and the bulk of the cell transistor 110. Electrons in the bulk are F-N tunneled into the floating gate FG by the potential difference. As the electrons are injected into the floating gate FG, threshold voltage of the cell transistor 110 rises, and thus the single-poly nonvolatile memory cell 100 may have a programmed state of an off-cell state.

Figure 3:
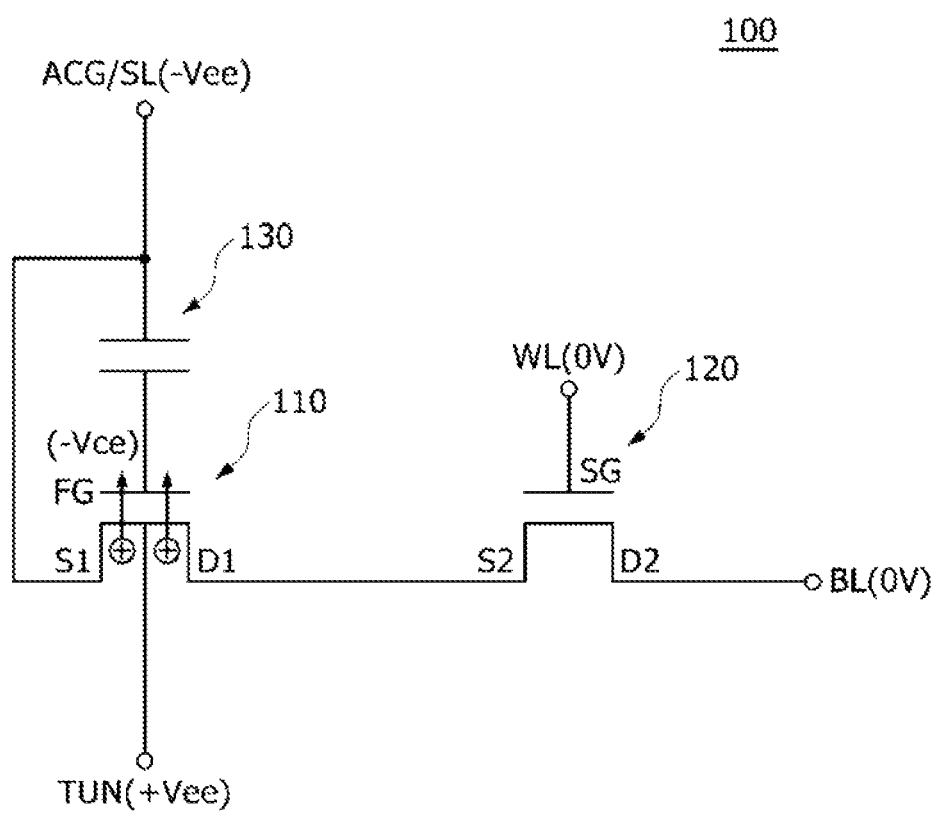
FIG. 3 is a circuit diagram illustrating an erase operation of the single-poly nonvolatile memory cell of FIG. 1.

FIG. 3 is a circuit diagram illustrating an erase operation of the single-poly nonvolatile memory cell 100 according to an embodiment. The same reference numerals used in FIG. 1 represent the same elements. Referring to FIG. 3, to erase the single-poly nonvolatile memory cell 100, a negative erase voltage −Vee and a positive erase voltage +Vee are applied to the array control gate/source line ACG/SL and to the tunneling line TUN, respectively.

The negative erase voltage −Vee and the positive erase voltage +Vee may have the same value and opposite polarity. In another embodiment, the negative erase voltage −Vee and the positive erase voltage +Vee may have different values from each other. The negative erase voltage −Vee and the positive erase voltage +Vee have values enabling the electrons injected into the floating gate FG to be F-N tunneled to the bulk by a potential difference between the positive erase voltage +Vee and a coupling voltage coupled to the floating gate FG by the negative erase voltage −Vee, and, additionally, enabling holes in the bulk to be F-N tunneled to the floating gate FG and to have a negative threshold voltage. In an embodiment, the negative erase voltage −Vee and the positive erase voltage +Vee may be about −5V and about +5V, respectively. A ground voltage, for example, 0V is applied to the word line WL and to the bit line BL. Accordingly, the selection transistor 120 is turned-off during the erase operation.

A negative erase coupling voltage −Vce is induced to the floating gate FG of the cell transistor 110. The negative erase coupling voltage −Vce may be induced by a coupling operation of the coupling capacitor 130 to the negative erase voltage −Vee applied through the array control gate/source line ACG/SL. A potential difference between the negative erase coupling voltage −Vce and the positive erase voltage +Vee is generated between the floating gate FG and the bulk of the cell transistor 110, and the electrons injected into the floating gate FG are F-N tunneled into the bulk by the potential difference. Holes in the bulk are additionally F-N tunneled into the floating gate FG so that the cell transistor 110 has a negative threshold voltage. As the cell transistor 110 has a negative threshold voltage, the single-poly nonvolatile memory cell 100 may have an erased state of an on-cell state.

Figure 4:
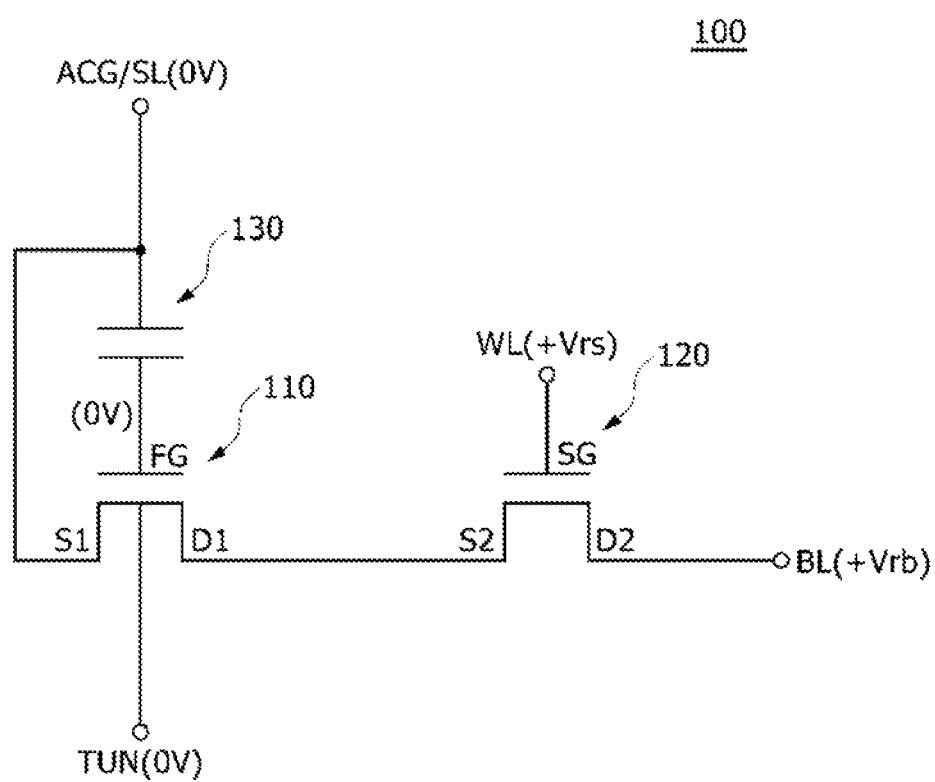
FIG. 4 is a circuit diagram illustrating a read operation of the single-poly nonvolatile memory cell of FIG. 1.

FIG. 4 is a circuit diagram illustrating a read operation of the single-poly nonvolatile memory cell 100 according to an embodiment. The same reference numerals used in FIG. 1 represent the same elements. Referring to FIG. 4, to read the single-poly nonvolatile memory cell 100, a ground voltage, for example, 0V is applied to the array control gate/source line ACG/SL and to the tunneling line TUN. A positive read selection voltage +Vrs and a positive read bit line voltage +Vrb are applied to the word line WL and to the bit line BL, respectively.

The positive read selection voltage +Vrs has a value capable of turning-on the selection transistor 120. In an embodiment, the positive read selection voltage +Vrs may be approximately about +3.3V. The positive read bit line voltage +Vrb has a value enabling a current to flow between the first source S1 of the cell transistor 110 and the second drain D2 of the selection transistor 120 when both of the cell transistor 110 and selection transistor 120 are turned-on. In an embodiment, the positive read bit line voltage +Vrb may be approximately about +1V.

The voltage of 0V is induced to the floating gate FG of the cell transistor 110. The selection transistor 120 is turned-on, and a current path is formed between the second source S2 and the second drain D2. Accordingly, whether the current flows between the array control gate/source line ACG/SL and the bit line BL is determined by the state of the cell transistor 110.

In an embodiment, when the cell transistor 110 is in a programmed state, that is, in an off-cell state, the cell transistor 110 maintains the turned-off state, and the current does not flow between the array control gate/source line ACG/SL and the bit line BL. In an embodiment, when the cell transistor 110 is in an erased state, that is, in an on-cell state, the cell transistor 110 maintains the turned-on state, and the current flows between the array control gate/source line ACG/SL and the bit line BL. As such, it is possible to read the state of the single-poly nonvolatile memory cell 100 according to whether the current flows between the array control gate/source line ACG/SL and the bit line BL.

Figure 5:
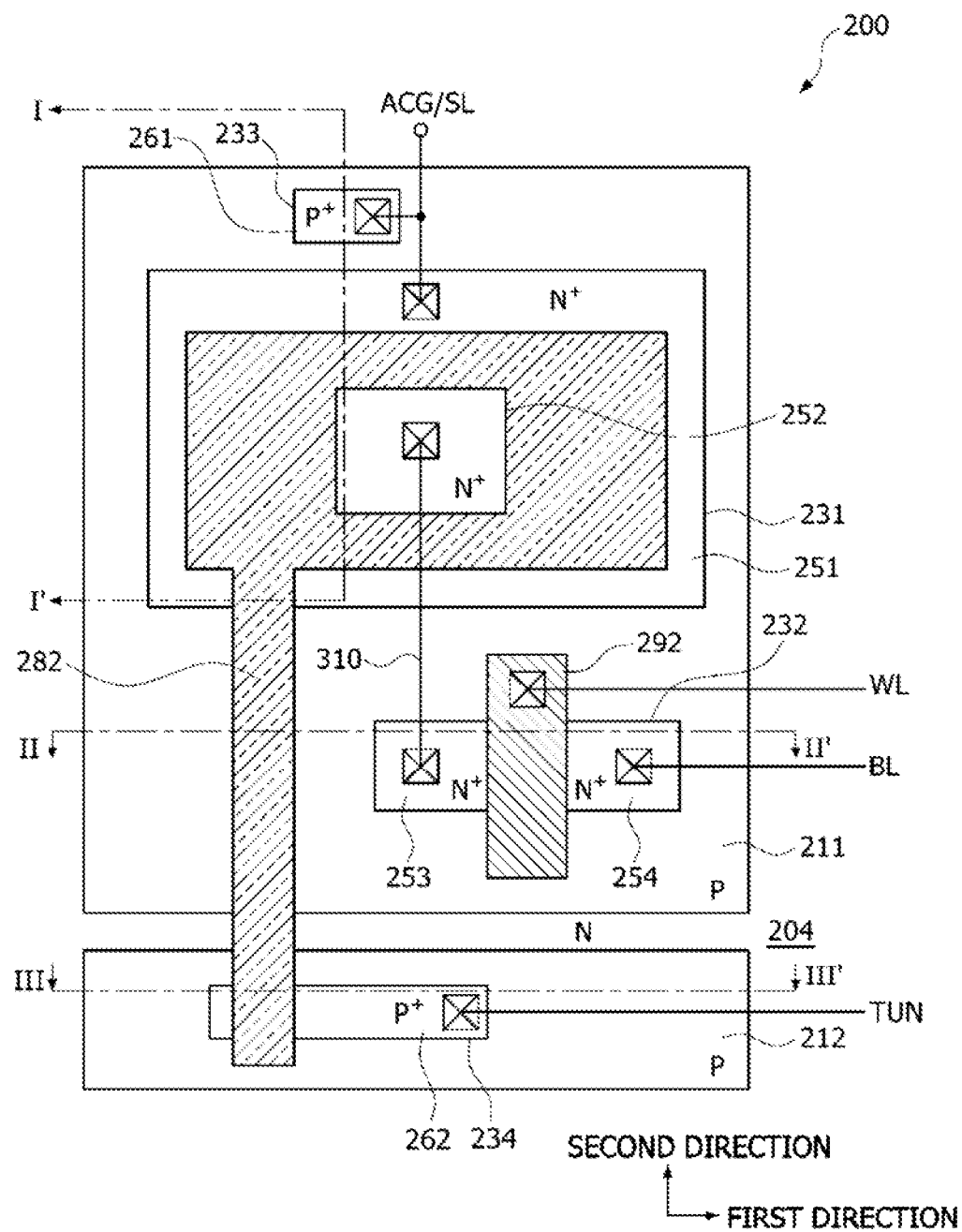
FIG. 5 is a layout diagram illustrating a single-poly nonvolatile memory cell according to an embodiment.

FIG. 5 is a layout diagram illustrating a planar structure of a single-poly nonvolatile memory cell 200 according to an embodiment. Referring to FIG. 5, the single-poly nonvolatile memory cell 200 includes a first P-type well region 211 and a second P-type well region 212 that are disposed in an N-type semiconductor region, for example, a deep N-well region 204. In an embodiment, the first P-type well region 211 may have a planar shape of a box shape. In an embodiment, the second P-type well region 212 may have a planar shape of a stripe shape elongated along a first direction.

The first P-type well region 211 and the second P-type well region 212 are spaced apart from each other along a second direction crossing the first direction. A coupling capacitor, a read cell transistor and a read selection transistor are disposed in the first P-type well region 211. A tunneling capacitor is disposed in the second P-type well region 212. The read cell transistor performs a read operation of the single-poly nonvolatile memory cell 200. The tunneling capacitor performs a program operation and a read operation of the single-poly nonvolatile memory cell 200.

A first active region 231, a second active region 232 and a third active region 233 are spaced apart from each other in the first P-type well region 211. The first to third active regions 231-233 may be defined by trench isolation layers, respectively.

A first N$^+$-type junction region 251 and a second N$^+$-type junction region 252 are disposed in the first active region 231. The first and second N$^+$-type junction regions 251 and 252 are spaced apart from each other. The first N$^+$-type junction region 251 surrounds the second N$^+$-type junction region 252. A region between the first N$^+$-type junction region 251 and the second N$^+$-type junction region 252 may be defined as a coupling/channel region.

The coupling/channel region serves as one of the electrodes of a coupling capacitor in the program operation and in the erase operation. The coupling/channel region serves as a channel region of the read cell transistor in the read operation. In the read operation, the first N$^+$-type junction region 251 and the second N$^+$-type junction region 252 serve as a source region and a drain region of the cell transistor, respectively. The first N$^+$-type junction region 251 may be coupled to the array control gate/source line ACG/SL.

A third N$^+$-type junction region 253 and a fourth N$^+$-type junction region 254 are disposed in the second active region 232. In an embodiment, the third and fourth N$^+$-type junction regions 253 and 254 may be a source region and a drain region of the read selection transistor, respectively. The third and fourth N$^+$-type junction regions 253 and 254 are spaced apart from each other in both edge regions of the second active region 232. A region between the third N$^+$-type junction region 253 and the fourth N$^+$-type junction region 254 may be defined as a channel region.

In the read operation, the channel region serves as a channel region of the read selection transistor. A read selection gate layer 292 is disposed over the channel region. Although not illustrated, an insulation layer may be disposed between the channel region and the read selection gate layer 292. The read selection gate layer 292 is coupled to a word line WL. The fourth N$^+$-type junction region 254 is coupled to a bit line BL. The third N$^+$-type junction region 253 is directly coupled to the second N$^+$-type junction region 252 in the first active region 231 through an interconnection 310.

A first P$^+$-type contact region 261 is disposed in the third active region 233. The first P$^+$-type contact region 261 is coupled to the array control gate/source line ACG/SL. That is, the first P$^+$-type contact region 261 is commonly coupled to the first N$^+$-type junction region 251 and to the array control gate/source line ACG/SL. Accordingly, a bias applied through the array control gate/source line ACG/SL is applied to the first P-type well region 211 through the first P$^+$-type contact region 261 in the third active region 233, and the bias is also applied to the first N$^+$-type junction region 251 in the first active region 231.

A floating gate layer 282 is disposed over a region between the first N$^+$-type junction region 251 and the second N$^+$-type junction region 252 in the first active region 231, that is, the coupling/channel region. Although not illustrated, an insulation layer may be disposed between the coupling/channel region and the floating gate layer 282.

The floating gate layer 282 is disposed in a floated state and is not directly coupled to any bias supplying line. The floating gate layer 282 passes over the first P-type well region 211 and extends to the second P-type well region 212. The floating gate layer 282 intersects the fourth active region 234 disposed in the second P-type well region 212. A second P$^+$-type contact region 262 and a tunneling region are disposed in the fourth active region 234. The floating gate layer 282 is overlapped with the tunneling region in a vertical direction. The second P$^+$-type contact region 262 may be coupled to a tunneling line TUN.

As such, in the single-poly nonvolatile memory cell 200 according to the embodiment, the coupling capacitor, the read cell transistor and the read selection transistor are disposed in the first P-type well region 211 together. Accordingly, the area of the single-poly nonvolatile memory cell 200 can be reduced in comparison with a case in which a coupling capacitor is disposed in one P-type well region, and the read cell transistor and the read selection transistor are separately disposed in different P-type well regions.

Figure 6:
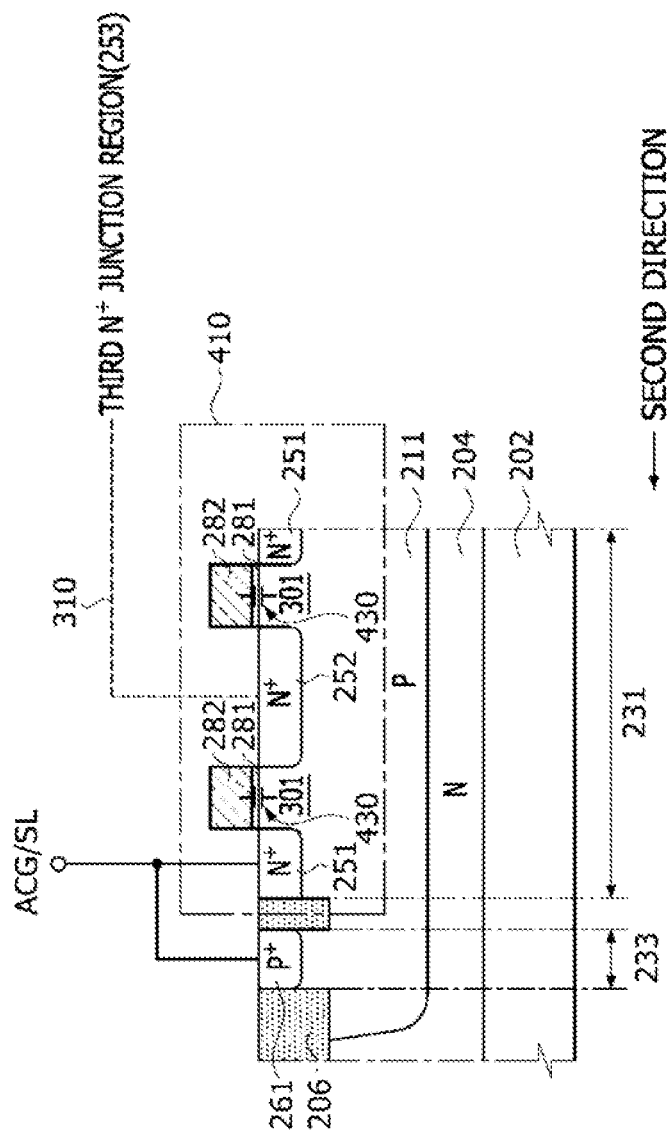
FIG. 6 is a cross-sectional view taken along the line I-I' of FIG. 5 and illustrating a coupling capacitor and a read cell transistor of the single-poly nonvolatile memory cell of FIG. 5.

FIG. 6 is a cross-sectional view taken along the line I-I' of FIG. 5, and illustrates a cross-sectional structure of a coupling capacitor 430 and a read cell transistor 410 of the single-poly nonvolatile memory cell according to an embodiment. The same reference numerals used in FIG. 5 represent the same elements.

Referring to FIG. 6, an N-type semiconductor region, for example, the deep N-well region 204 is disposed on a substrate 202. The first P-type well region 211 is disposed in an upper region of the deep N-well region 204. The first active region 231 and the third active region 233 are spaced apart from each other along the second direction in an upper region of the first P-type well region 211. The first active region 231 and the third active region 233 are defined by a trench isolation layer 206.

The first N$^+$-type junction region 251 and the second N$^+$-type junction region 252 are disposed in an upper region of the first active region 231. As described with reference to FIG. 5, the first N$^+$-type junction region 251 surrounds the second N$^+$-type junction region 252. The first and second N$^+$-type junction regions 251 and 252 are spaced apart from each other by a coupling/channel region 301. A first gate insulation layer 281 and the floating gate layer 282 are disposed over the coupling/channel region 301. The first P$^+$-type contact region 261 is disposed over the third active region 233. The first N$^+$-type junction region 251 in the first active region 231 and the first P$^+$-type contact region 261 in the third active region 233 are commonly coupled to the array control gate/source line ACG/SL.

A stack structure of the coupling/channel region 301, the first gate insulation layer 281 and the floating gate layer 282 constitutes a coupling capacitor 430 of a MOS capacitor structure. The coupling/channel region 301 and the floating gate layer 282 constitute a first electrode and a second electrode of the coupling capacitor 430, respectively. In the program and erase operations of the single-poly nonvolatile memory cell, a bias voltage applied to the array control gate/source line ACG/SL is induced to the coupling/channel region 301 through the first P$^+$-type contact region 261. By a coupling operation of the coupling capacitor 430, a coupling voltage coupled to the bias voltage can be induced to the floating gate layer 282.

The first N$^+$-type junction region 251, the second N$^+$-type junction region 252, the coupling/channel region 301, the first gate insulation layer 281 and the floating gate layer 282 constitute a read cell transistor 410 of an N-channel type MOS transistor. The first N$^+$-type junction region 251 and the second N$^+$-type junction region 252 may be a source region and a drain region of the read cell transistor 410, respectively. As shown by a dotted line in the drawing, the second N$^+$-type junction region 252 is directly coupled to the third N$^+$-type junction region 253.

When a potential difference with a predetermined value is generated between the first N$^+$-type junction region 251 and the second N$^+$-type junction region 252, and a read voltage, for example, a coupling voltage of 0V is induced to the floating gate layer 282, current flows or does not flow between the array control gate/source line ACG/SL and the interconnection 310 according to a polarity of a threshold voltage at the coupling/channel region 301.

In an embodiment, when the single-poly nonvolatile memory cell is in a programmed state, that is, the threshold voltage of the coupling/channel region 301 has a positive polarity and the coupling voltage of 0V is induced to the floating gate layer 282, current does not flow between the array control gate/source line ACG/SL and the interconnection 310. However, when the single-poly nonvolatile memory cell is in an erased state, that is, the threshold voltage of the coupling/channel region 301 has a negative polarity and the coupling voltage of 0V is induced to the floating gate layer 282, current flows between the array control gate/source line ACG/SL and the interconnection 310. As such, a state of the single-poly nonvolatile memory cell can be read by operations of the read cell transistor 410.

Figure 7:
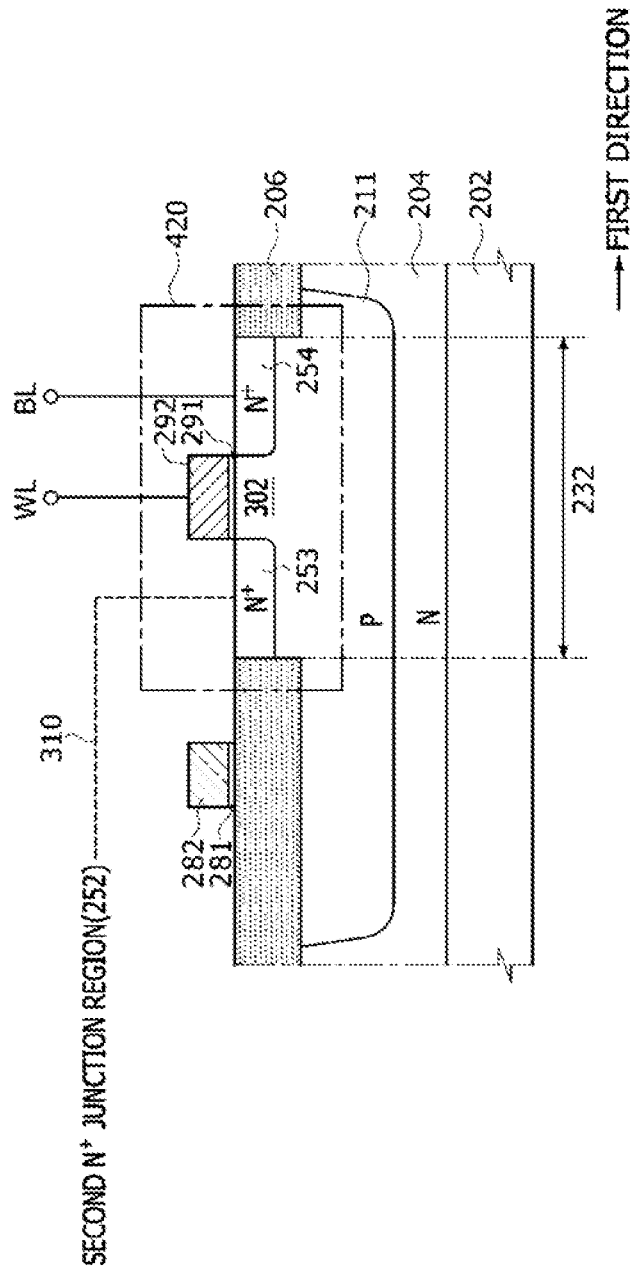
FIG. 7 is a cross-sectional view taken along the line II-II' of FIG. 5 and illustrating a read selection transistor of the single-poly nonvolatile memory cell of FIG. 5.

FIG. 7 is a cross-sectional view taken along the line II-II' of FIG. 5, and illustrates a cross-sectional structure of a read selection transistor 420 of the single-poly nonvolatile memory cell according to an embodiment. The same reference numerals as FIGS. 5 and 6 represent the same elements. Duplicate descriptions of some of the elements may be omitted.

Referring to FIG. 7, the third N$^+$-type junction region 253 and the fourth N$^+$-type junction region 254 are disposed in the second active region 232 in an upper region of the first P-type well region 211. The third N$^+$-type junction region 253 and the fourth N$^+$-type junction region 254 are spaced apart from each other by a channel region 302. A second gate insulation layer 291 and a read selection gate layer 292 are disposed over the channel region 302. The read selection gate layer 292 is coupled to the word line WL. The fourth N$^+$-type junction region 254 is coupled to the bit line BL. The third N$^+$-type junction region 253, the fourth N$^+$-type junction region 254, the channel region 302, the second gate insulation layer 291 and the read selection gate layer 292 constitute a read selection transistor 420 of an N-channel type MOS transistor. The third N$^+$-type junction region 253 and the fourth N$^+$-type junction region 254 may be a source region and a drain region of the read selection transistor 420, respectively. As shown by a dotted line in the drawing, the third N$^+$-type junction region 253 is directly coupled to the second N$^+$-type junction region 252 through the interconnection 310.

A read operation for the single-poly nonvolatile memory cell may be performed or may not be performed depending on a state of the read selection transistor 420. For example, when a bias voltage greater than a threshold voltage of the channel region 302 is applied to the read selection gate layer 292 through the word line WL and a predetermined bit line voltage is applied to the fourth N$^+$-type junction region 254 through the bit line BL, the read selection transistor 420 is turned-on. An inversion layer is formed in the channel region 302 and a current path is formed between the third N$^+$-type junction region 253 and the fourth N$^+$-type junction region 254. When carriers, for example, electrons are supplied to the third N$^+$-type junction region 253 from the second N$^+$-type junction region 252, current flows in the read selection transistor 420. However, when the electrons are not supplied to the third N$^+$-type junction region 253 from the second N$^+$-type junction region 252, current does not flow in the read selection transistor 420.

Figure 8:
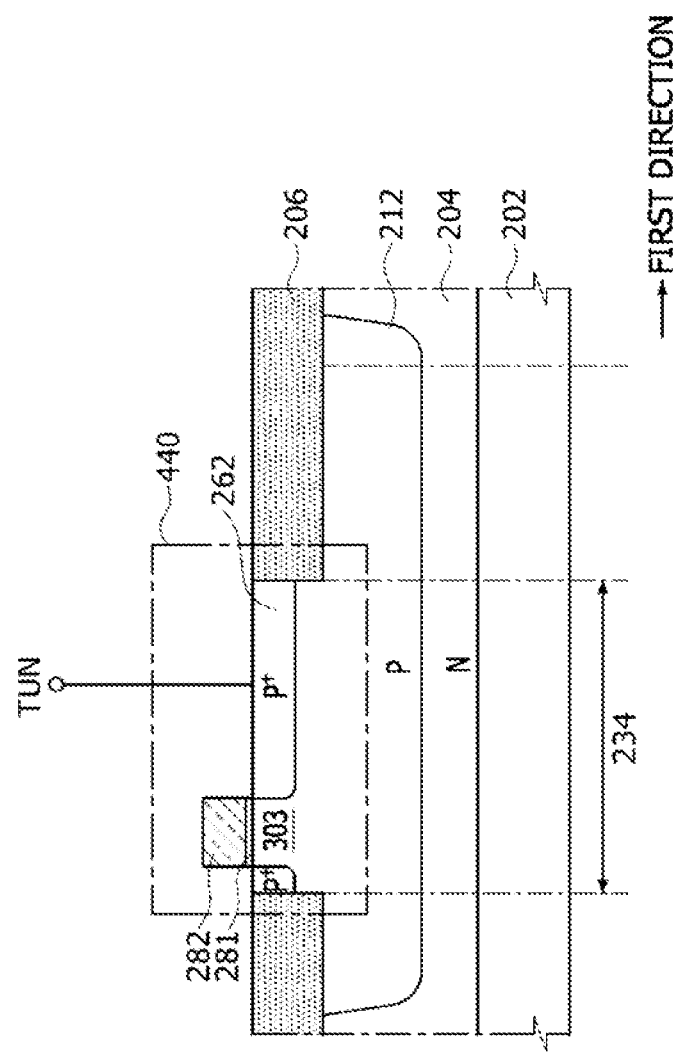
FIG. 8 is a cross-sectional view taken along the line III-III' of FIG. 5 and illustrating a tunneling capacitor of the single-poly nonvolatile memory cell of FIG. 5.

FIG. 8 is a cross-sectional view taken along the line III-III' of FIG. 5, and illustrates a cross-sectional structure of a tunneling capacitor 440 of the single-poly nonvolatile memory cell according to an embodiment. The same reference numerals used in FIGS. 5 to 7 represent the same elements. Duplicate descriptions of some of the elements may be omitted.

Referring to FIG. 8, the second P$^+$-type contact region 262 is disposed in an upper region of the second P-type well region 212 of the fourth active region 234. The second P$^+$-type contact region 262 is coupled to the tunneling line TUN. A tunneling region 303 is disposed in an upper region of the fourth active region 234. The tunneling region 303 is adjacent to the second P$^+$-type contact region 262. The tunneling region 303, the first gate insulation layer 281 over the tunneling region 303 and the floating gate layer 282 constitute the tunneling capacitor 440. Electrons or holes may be injected into the floating gate layer 282 by a potential difference between a coupling voltage induced to the floating gate layer 282 and a voltage applied to the tunneling region 303 from the tunneling line TUN through the second P$^+$-type contact region 262.

The coupling capacitor 130 disposed between the floating gate FG of the cell transistor 110 and the array control gate/source line ACG/SL shown in FIG. 1 can be implemented into the coupling capacitor 430 of a MOS capacitor structure shown in FIG. 6.

When performing a program operation, an erase operation and a read operation, a coupling voltage is induced to the floating gate layer 292 by the coupling capacitor 430 shown in FIG. 6. The read cell transistor 410 and the tunneling capacitor 440 shown in FIGS. 6 and 8, respectively, constitute the cell transistor 110 shown in FIG. 1. The cell transistor 110 shown in FIG. 1 functions as the tunneling capacitor 440 shown in FIG. 8 in the program and erase operations, and functions as the read cell transistor 410 of FIG. 6 in the read operation. The read selection transistor 420 of FIG. 7 constitutes the selection transistor 120 shown in FIG. 1.

Figure 9:
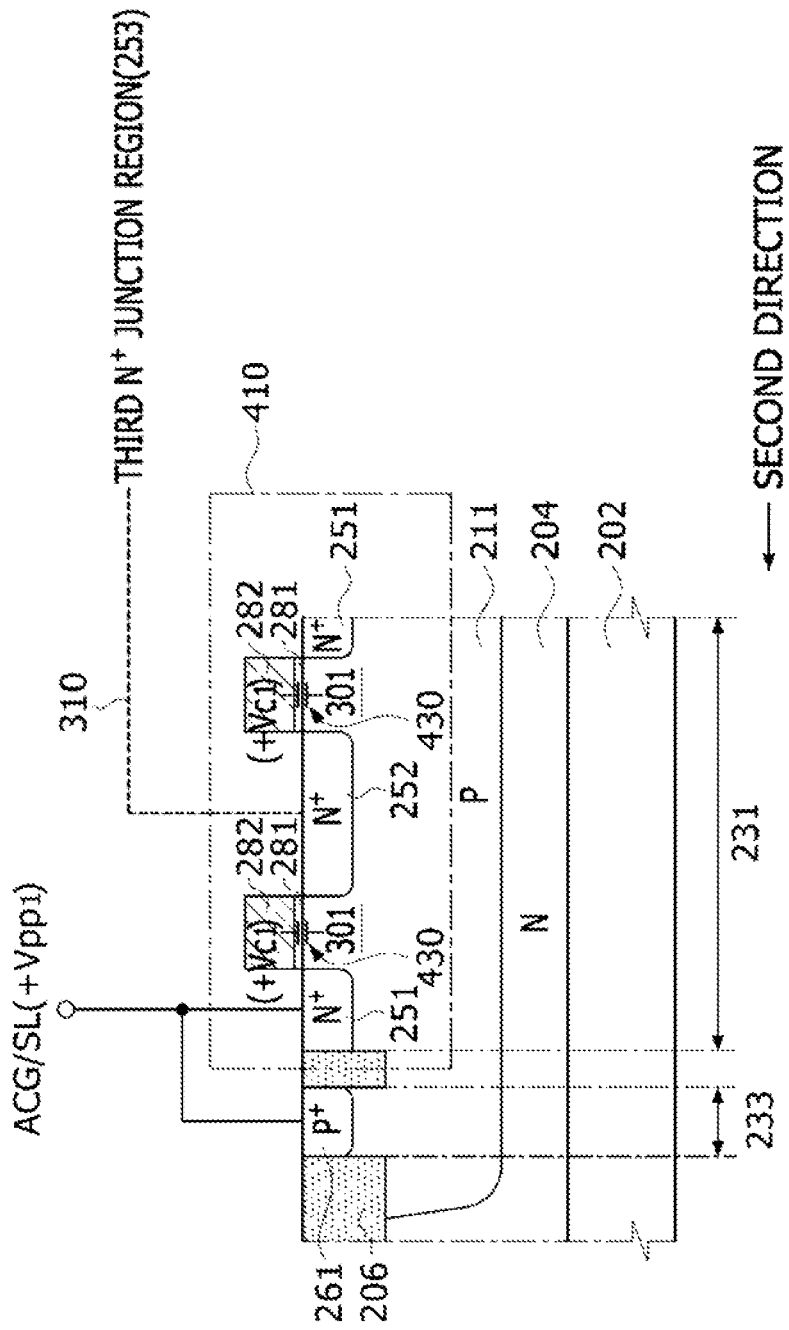
FIGS. 9 to 11 are cross-sectional views illustrating a program operation of the single-poly nonvolatile memory cell of FIG. 5.
Figure 10:
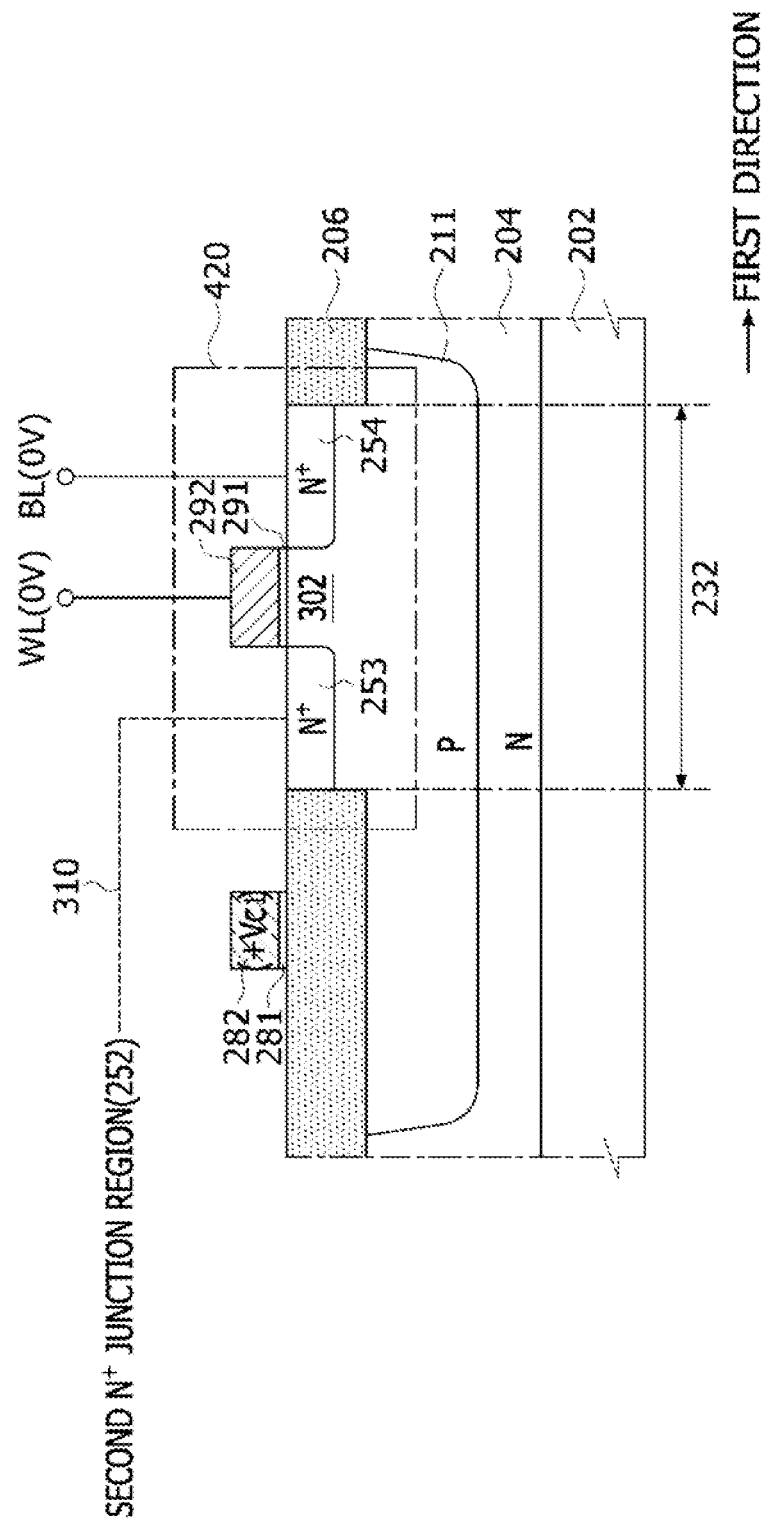
Figure 11:
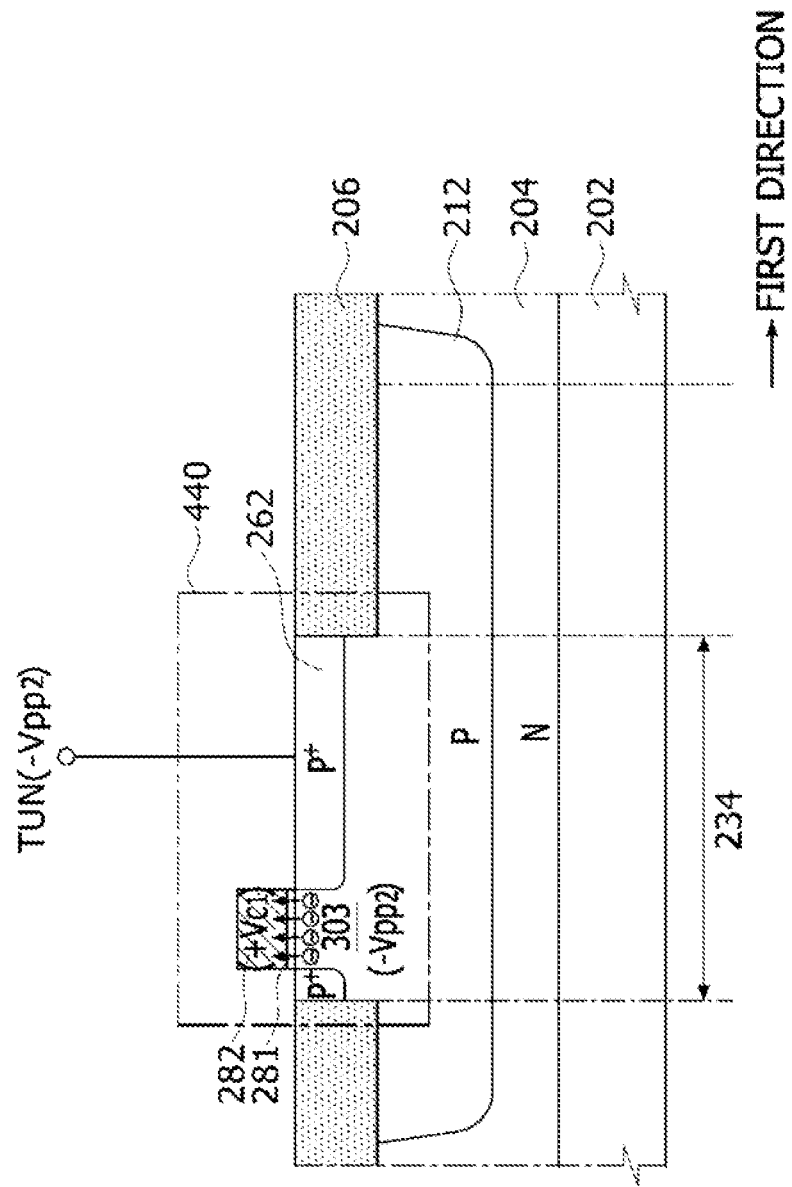

FIGS. 9 to 11 are cross-sectional views illustrating a program operation of the single-poly nonvolatile memory cell of FIG. 5. The same reference numerals used in FIGS. 5 to 8 represent the same elements.

Referring to FIGS. 9 to 11, to program the single-poly nonvolatile memory cell, a positive first program voltage +Vpp1 is applied to the array control gate/source line ACG/SL. A ground voltage, for example, 0V is applied to the word line WL and to the bit line BL. A negative second program voltage −Vpp2 is applied to the tunneling line TUN. In an embodiment, the positive first program voltage +Vpp1 and the negative second program voltage −Vpp2 may be about +5V and about −5V, respectively.

As illustrated in FIG. 9, the positive first program voltage +Vpp1 applied to the array control gate/source line ACG/SL is applied to the first P-type well region 211, that is, the coupling/channel region 301 through the first P$^+$-type contact region 261. A positive first coupling voltage +Vc1 is induced and applied to the floating gate layer 282 by a coupling operation of the coupling capacitor 301 and the positive first program voltage +Vpp1. The value of the positive first coupling voltage +Vc1 may be determined by a coupling ratio of the coupling capacitor 301.

As illustrated in FIG. 11, the negative second program voltage −Vpp2 applied to the tunneling line TUN is transferred to the second P-type well region 212, that is, the tunneling region 303 through the second P$^+$-type contact region 262. Accordingly, a potential difference +Vc1−(−Vpp2) corresponding to a difference of the positive first coupling voltage +Vc1 and the negative second program voltage −Vpp2 is generated between the floating gate layer 282 of the tunneling capacitor 440 and the tunneling region 303.

Electrons are F-N tunneled from the tunneling region 303 to the floating gate layer 282 by the potential difference. Accordingly, the single-poly nonvolatile memory cell is in a programmed state of an off-cell state and has a threshold voltage higher than, for example, 0V. As shown in FIG. 10, as a voltage of 0V is applied to the word line WL and bit line BL, the read selection transistor 420 is turned-off. Accordingly, the read selection transistor 420 does not affect the program operation of the memory cell.

Figure 12:
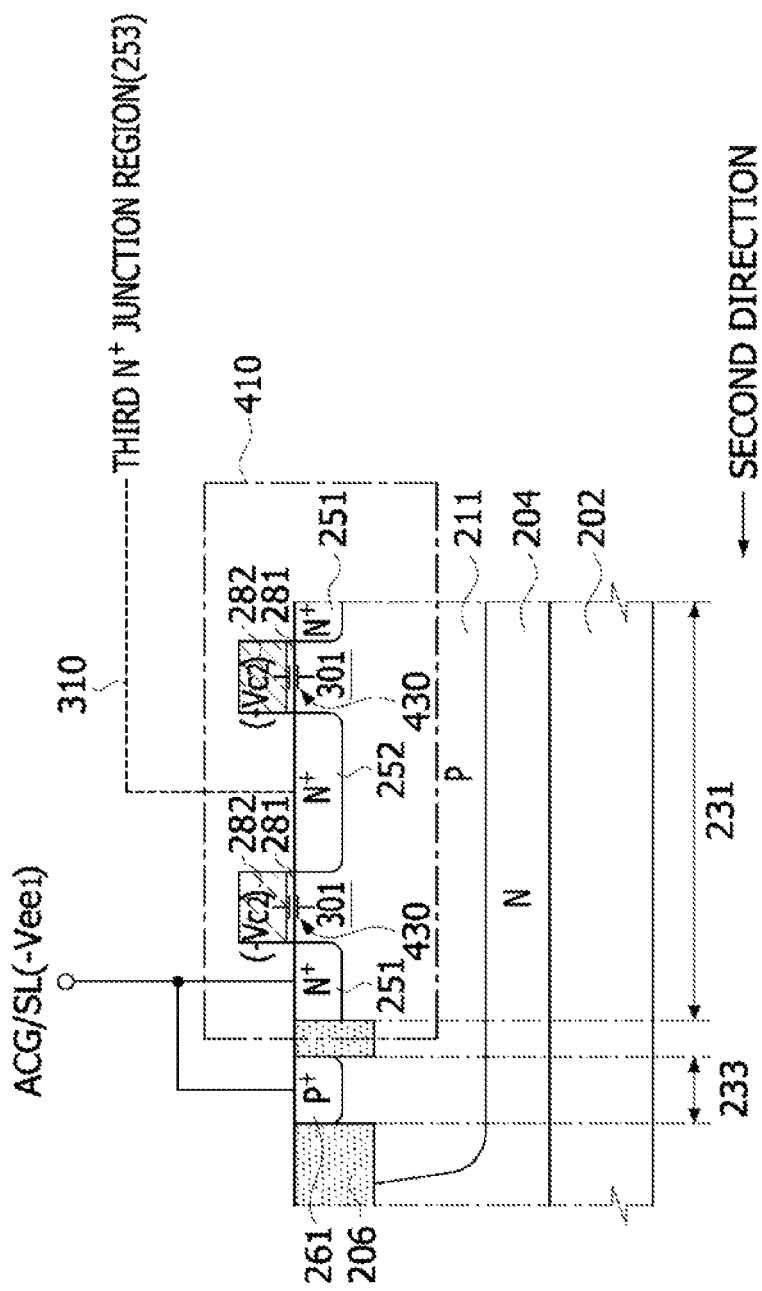
FIGS. 12 to 14 are cross-sectional views illustrating an erase operation of the single-poly nonvolatile memory cell of FIG. 5.
Figure 13:
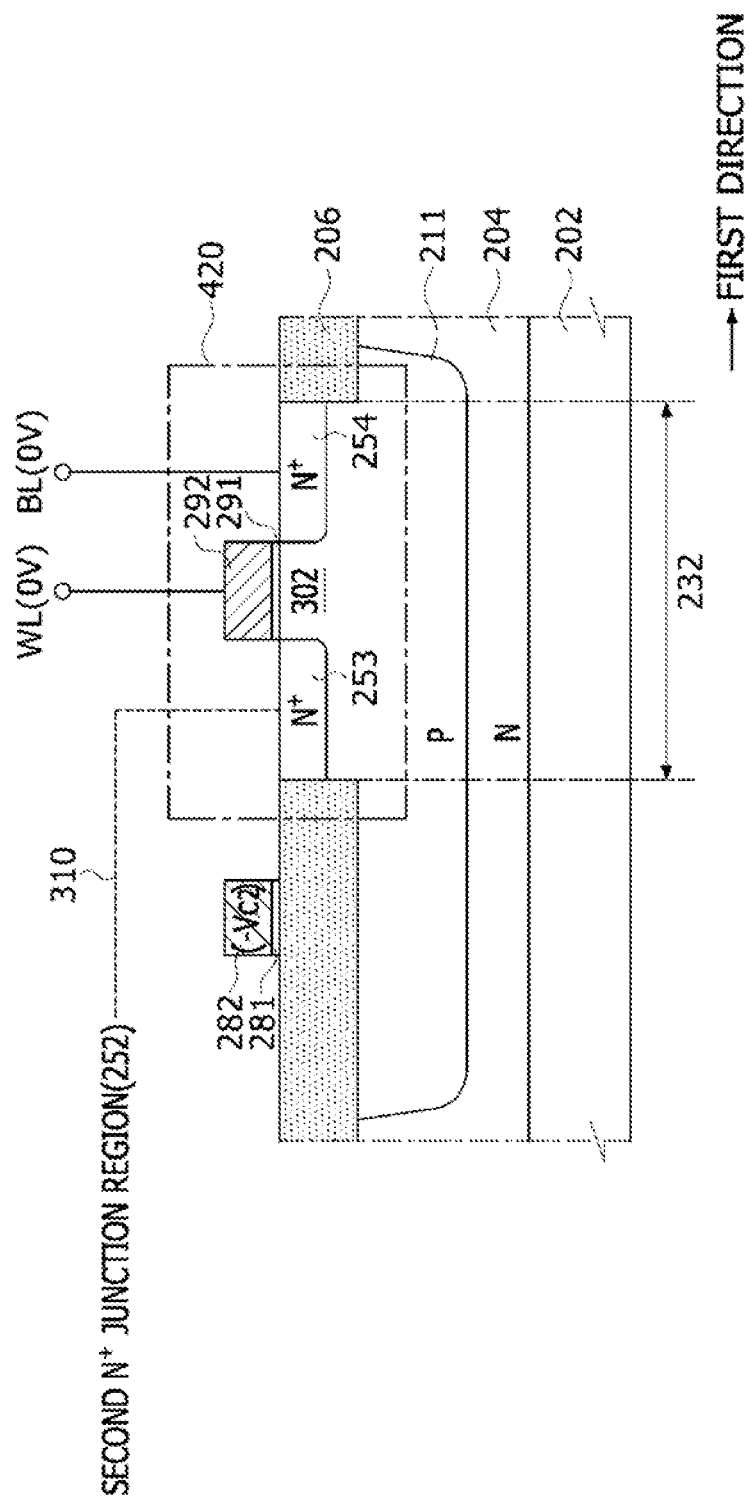
Figure 14:
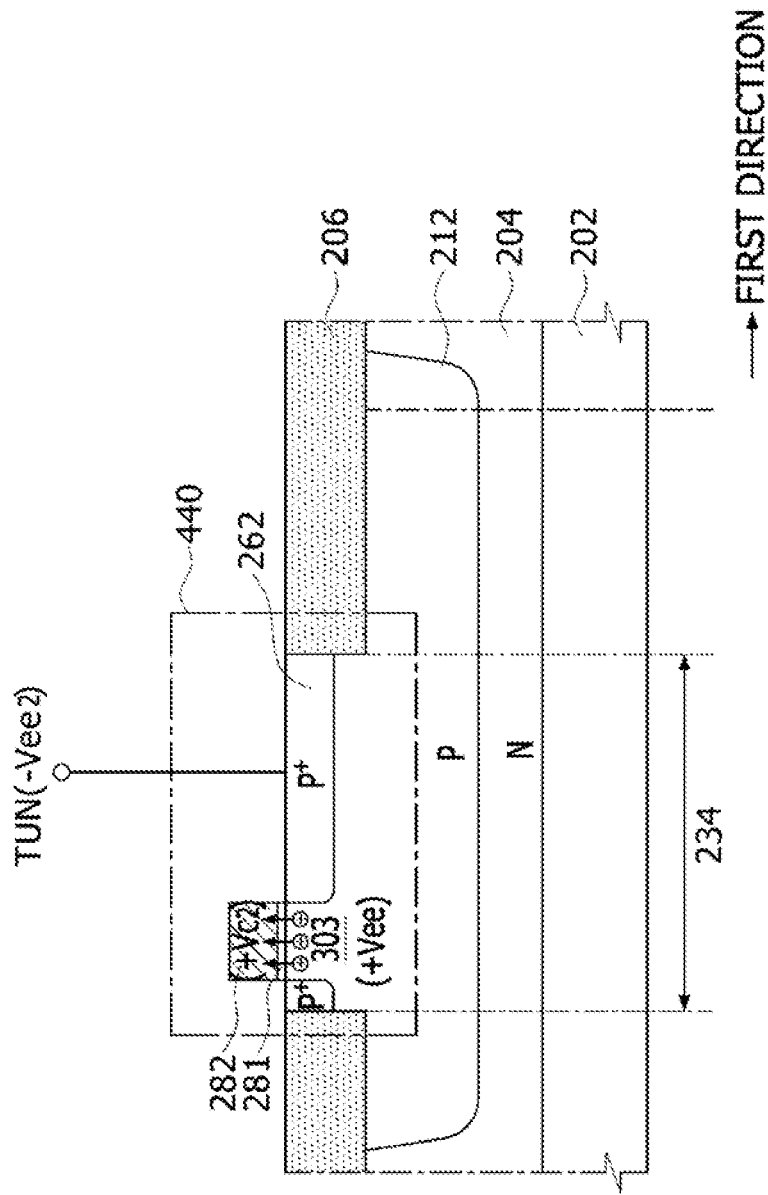

FIGS. 12 to 14 are cross-sectional views illustrating an erase operation of the single-poly nonvolatile memory cell of FIG. 5. The same reference numerals used in FIGS. 5 to 8 represent the same elements.

Referring to FIGS. 12 to 14, to erase the single-poly nonvolatile memory cell, a negative first erase voltage −Vee1 is applied to the array control gate/source line ACG/SL. A ground voltage, for example, 0V is applied to the word line WL and bit line BL. A positive second erase voltage +Vee2 is applied to the tunneling line TUN. In an embodiment, the negative first erase voltage −Vee1 and the positive second erase voltage +Vee2 may be about −5V and about +5V, respectively. As shown in FIG. 12, the negative first erase voltage −Vee1 applied to the array control gate/source line ACG/SL is transferred to the first P-type well region 211, that is, the coupling/channel region 301 through the first P$^+$-type contact region 261. A negative second coupling voltage −Vc2 is induced to the floating gate layer 282 by a coupling operation of the coupling capacitor 301 and the negative first erase voltage −Vee1. The value of the negative second coupling voltage −Vc2 can be determined by a coupling ratio of the coupling capacitor 301.

As illustrated in FIG. 14, the positive second erase voltage +Vee2 applied to the tunneling line TUN is transferred to the second P-type well region 212, that is, the tunneling region 303 through the second P$^+$-type contact region 262. Accordingly, a potential difference −Vc2−(+Vee2) corresponding to a difference of the negative second coupling voltage −Vc2 and the positive second erase voltage +Vee2 is generated between the floating gate layer 282 of the tunneling capacitor 440 and the tunneling region 303. Holes are F-N tunneled from the tunneling region 303 to the floating gate layer 282 by the potential difference. Furthermore, the electrons in the floating gate layer 282 are additionally F-N tunneled to the tunneling region 303 by the potential difference. This represents the same effect as when holes in the tunneling region 303 are injected into the floating gate layer 282. Accordingly, the single-poly nonvolatile memory cell is in an erased state of on-cell state and has a threshold voltage which is lower than, for example, 0V.

As shown in FIG. 13, as a voltage of 0V is applied to the word line WL and bit line BL, the read selection transistor 420 is turned-off. Accordingly, the read selection transistor 420 does not affect the program operation of the memory cell.

Figure 15:
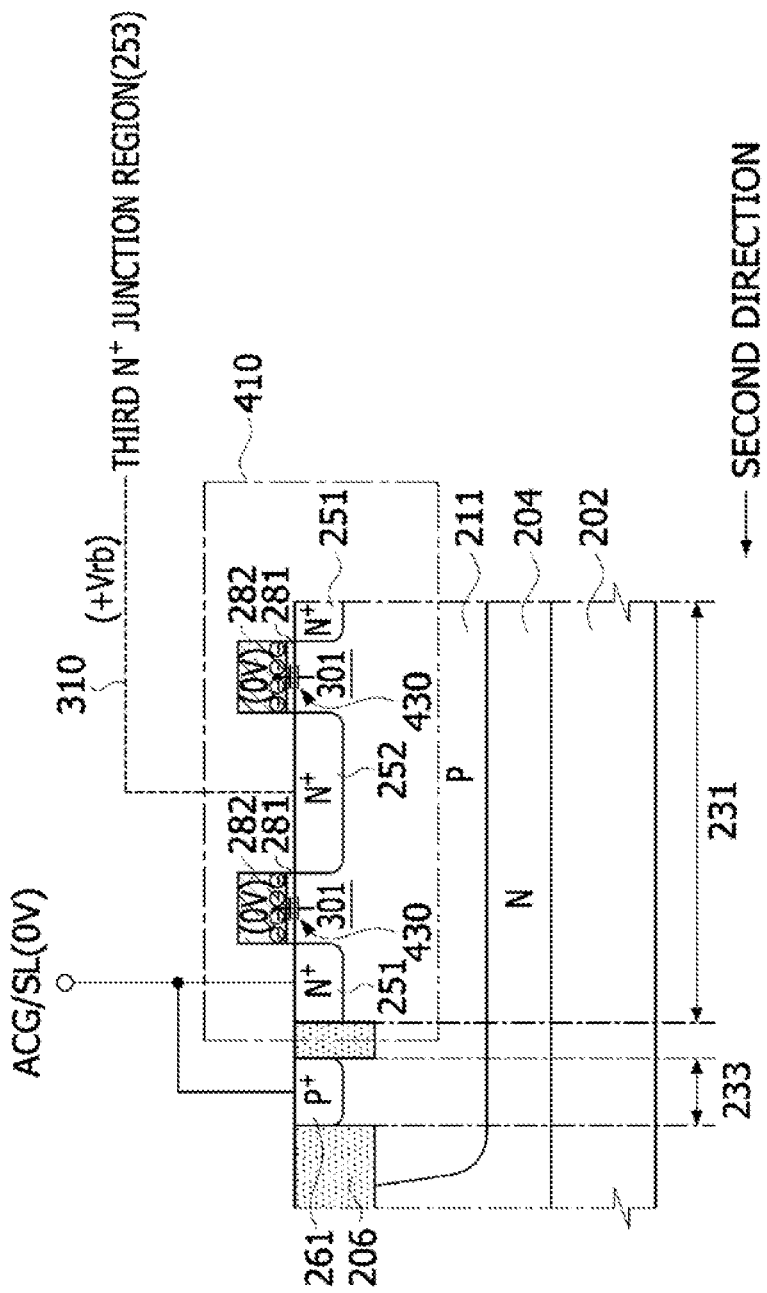
FIGS. 15 and 16 are cross-sectional views illustrating a read operation of a programmed single-poly nonvolatile memory cell of FIG. 5.
Figure 16:
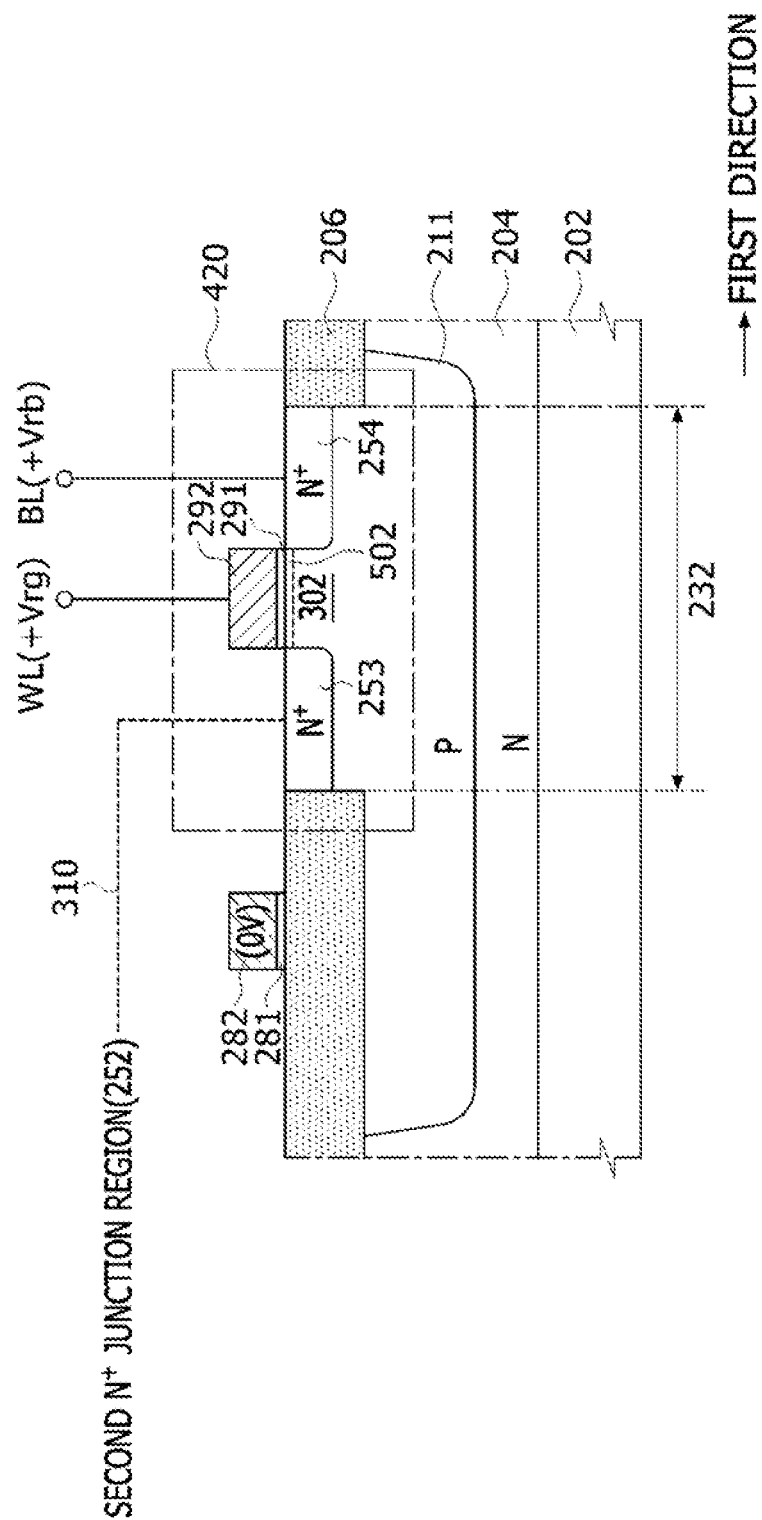

FIGS. 15 and 16 are cross-sectional views illustrating a read operation of the single-poly nonvolatile memory cell of FIG. 5. The same reference numerals used in FIGS. 5 to 8 represent the same elements.

Referring to FIGS. 15 and 16, a ground voltage, for example, 0V is applied to the array control gate/source line ACG/SL to read the single-poly nonvolatile memory cell of a programmed state, that is, of an off-cell state. Although not illustrated, 0V is also applied to the tunneling line TUN. A positive read gate voltage +Vrg and a positive read bit line voltage +Vrb are applied to the word line WL and the bit line BL, respectively. In an embodiment, the positive read gate voltage +Vrg and the positive read bit line voltage +Vrb may be about +3.3V and about +1V, respectively. As shown in FIG. 15, a coupling voltage of 0V is induced to the floating gate layer 282 by the voltage of 0V applied to the array control gate/source line ACG/SL.

As illustrated in FIG. 16, as the positive read gate voltage +Vrg is applied to the word line WL, the read selection transistor 420 is turned-on. An inversion layer 502 is formed in the channel region 302 of the read selection transistor 420, and the positive read bit line +Vrb applied to the bit line BL is transferred to the third N$^+$-type junction region 253. As the third N$^+$-type junction region 253 is directly coupled to the second N$^+$-type junction region 252, as shown in FIG. 15, the positive read bit line voltage +Vrb is transferred to the second N$^+$-type junction region 252. Accordingly, a current moving path is formed through the second N$^+$-type junction region 252, the third N$^+$-type junction region 253, and the fourth N$^+$-type junction region 254.

However, since the single-poly nonvolatile memory cell is in a programmed state, that is, in a turned-off state, the inversion layer is not formed in the coupling/channel region 301 when 0V is applied to the floating gate 282. Accordingly, even though the read selection transistor 420 is turned-on, the read cell transistor 410 maintains the turned-off state, and current does not flow between the array control gate/source line ACG/SL and the bit line BL.

FIG. 17 is a cross-sectional view illustrating a read operation of the erased single-poly nonvolatile memory cell at an on-cell state. The same reference numerals used in FIG. 15 represent the same elements.

Referring to FIG. 17, a ground voltage, for example, 0V is applied to the array control gate/source line ACG/SL to read the single-poly nonvolatile memory cell of an erased state, that is, an on-cell state. Although not illustrated, 0V is also applied to the tunneling line TUN. As described with reference to FIG. 16, a positive read gate voltage +Vrg and a positive read bit line voltage +Vrb are applied to the word line WL and to the bit line BL, respectively. As shown in FIG. 17, a coupling voltage of 0V is induced to the floating gate layer 282 by the voltage of 0V applied to the array control gate/source line ACG/SL.

As described with reference to FIG. 16, as the positive read gate voltage +Vrg is applied to the word line WL, the read selection transistor 420 is turned-on. Additionally, the positive read bit line +Vrb applied to the bit line BL is transferred to the second $N^+$-type junction region 252. Accordingly, a current path is formed through the second $N^+$-type junction region 252, the third $N^+$-type junction region 253 and the fourth $N^+$-type junction region 254. Since the single-poly nonvolatile memory cell is an erased state, that is, a turned-on state, the read cell transistor 410 maintains the turned-on state when the voltage of 0V is applied to the floating gate 282. Accordingly, current flows between the array control gate/source line ACG/SL and the bit line BL.

Furthermore, since the first $N^+$-type junction region 251 surrounds the second $N^+$-type junction region 252, the current moving path from the first $N^+$-type junction region 251 to the second $N^+$-type Junction region 252 is constituted with respect to all sides of the second $N^+$-type junction region 252. Accordingly, the amount of the current can be increased, and it can compensate for a loss generated by the interconnection (310 of FIG. 5) between the second $N^+$-type junction region 252 and the third $N^+$-type junction region 253.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A single-poly nonvolatile memory cell comprising:
   a first P-type well region and a second P-type well region disposed in an N-type semiconductor region and spaced apart from each other, wherein first, second, and third active regions are formed in the first P-type well region and spaced apart from each other, wherein a fourth active region is formed in the second P-type well region;
   a first $N^+$-type junction region and a second $N^+$-type junction region disposed in the first active region and spaced apart from each other by a coupling/channel region;
   a third $N^+$-type junction region and a fourth $N^+$-type junction region disposed in the second active region and spaced apart from each other by a channel region;
   a first $P^+$-type contact region disposed in a third active region;
   a second $P^+$-type contact region coupled to a tunneling region in the fourth active region;
   a read selection gate layer disposed over the channel region;
   a floating gate layer disposed over the coupling/channel region and extending to over the tunneling region; and
   an interconnection connecting the second $N^+$-type junction region to the third $N^+$-type junction region.

2. The single-poly nonvolatile memory cell of claim 1, wherein the first $N^+$-type junction region surrounds the second $N^+$-type junction region.

3. The single-poly nonvolatile memory cell of claim 1, further comprising:
   a first gate insulation layer disposed between the coupling/channel region and the floating gate layer; and
   a second gate insulation layer disposed between the channel region and the read selection gate layer.

4. The single-poly nonvolatile memory cell of claim 3, wherein a stack structure of the coupling/channel region, the first gate insulation layer, and the floating gate layer constitutes a coupling capacitor of a MOS capacitor structure.

5. The single-poly nonvolatile memory cell of claim 3, wherein the first $N^+$-type junction region, the second $N^+$-type junction region, the coupling/channel region, the first gate insulation layer, and the floating gate layer constitute a read cell transistor of an N-channel type MOS transistor.

6. The single-poly nonvolatile memory cell of claim 3, wherein the third $N^+$-type junction region, the fourth $N^+$-type junction region, the channel region, the second gate insulation layer, and the read selection gate layer constitute a read selection transistor of an N-channel type MOS transistor.

7. The single-poly nonvolatile memory cell of claim 3, wherein the first gate insulation layer further extends between the tunneling region and the floating gate layer in the fourth active region, and
   wherein the tunneling region, and the first gate insulation layer and the floating gate layer on the tunneling region in the fourth active region, constitute a tunneling capacitor of a MOS capacitor structure.

8. The single-poly nonvolatile memory cell of claim 1, further comprising:
   an array control gate/source line commonly coupled to the second $N^+$-type junction region and the first $P^+$-type contact region;
   a word line coupled to the read selection gate layer;
   a bit line coupled to the fourth $N^+$-type junction region; and
   a tunneling line coupled to the second $P^+$-type contact region.

9. The single-poly nonvolatile memory cell of claim 8, wherein a program operation is performed by applying a positive first program voltage and a negative second program voltage to the array control gate/source line and the tunneling line, respectively, and applying a ground voltage to the word line and the bit line.

10. The single-poly nonvolatile memory cell of claim 9, wherein an erase operation is performed by applying a negative first erase voltage and a positive second erase voltage to the array control gate/source line and the tunneling line, respectively, and applying a ground voltage to the word line and the bit line.

11. The single-poly nonvolatile memory cell of claim 10, wherein each of the coupling/channel region and the tunneling region has a positive threshold voltage in the program operation, and
    wherein each of the coupling/channel region and the tunneling region has a negative threshold voltage in the erase operation.

12. The single-poly nonvolatile memory cell of claim 11, wherein a read operation is performed by applying a ground voltage to the array control gate/source line and the tunneling line, and applying a positive read gate voltage and a positive read bit line voltage to the word line and the bit line, respectively.

* * * * *